(12) United States Patent
Schrems

(10) Patent No.: US 6,500,707 B2
(45) Date of Patent: Dec. 31, 2002

(54) METHOD FOR MANUFACTURING A TRENCH CAPACITOR OF A MEMORY CELL OF A SEMICONDUCTOR MEMORY

(75) Inventor: Martin Schrems, Eggersdorf B. Graz (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/100,812

(22) Filed: Mar. 19, 2002

(65) Prior Publication Data

US 2002/0132421 A1 Sep. 19, 2002

(30) Foreign Application Priority Data

Mar. 19, 2001 (DE) .......................................... 101 13 187

(51) Int. Cl.7 .......................................... H01L 21/8242
(52) U.S. Cl. ...................... 438/249; 438/247; 438/246; 438/245; 438/244; 438/243; 438/392; 438/390; 438/389; 438/388; 438/387; 438/386
(58) Field of Search ................................. 438/243–249, 438/386–392

(56) References Cited

U.S. PATENT DOCUMENTS

| 5,744,386 | A | | 4/1998 | Kenney |
| 6,025,245 | A | * | 2/2000 | Wei ............................ 438/243 |
| 6,066,527 | A | | 5/2000 | Kudelka et al. |
| 6,200,873 | B1 | * | 3/2001 | Schrems et al. ............ 438/242 |
| 6,271,079 | B1 | * | 8/2001 | Wei et al. .................... 438/239 |
| 6,309,924 | B1 | * | 10/2001 | Divakaruni et al. ........ 365/149 |
| 6,365,485 | B1 | * | 4/2002 | Shiao et al. ................. 438/249 |
| 6,420,239 | B2 | * | 7/2002 | Weis ........................... 438/239 |

FOREIGN PATENT DOCUMENTS

| DE | 19956078 A | * | 5/2001 | ....... H01L/21/8242 |
| JP | 2000-036578 | * | 2/2000 | ......... H01L/27/108 |
| WO | WO01/39256 A2 | | 5/2001 | |
| WO | WO02/23636 A1 | | 3/2002 | |

* cited by examiner

Primary Examiner—John F. Niebling
Assistant Examiner—Jennifer M. Kennedy
(74) Attorney, Agent, or Firm—Laurence A. Greenberg; Werner H. Stemer; Ralph E. Locher

(57) ABSTRACT

A trench is formed in a substrate with an upper region and a lower region. The trench is subsequently widened in its upper region and in its lower region by isotropic etching. In the upper region, an insulating collar is formed that is designated as a buried insulating collar due to the widened trench. The insulating collar is removed in the vicinity of the surface of the substrate, through which the substrate is exposed in this region. Here, a selective epitaxial layer is subsequently grown in the trench, through which a subsequently formed selection transistor can be formed in perpendicular fashion over the trench, or very close to the trench. In addition, through the widened trench the electrode surface of the capacitor electrodes is enlarged, which ensures an increased storage capacity.

11 Claims, 17 Drawing Sheets

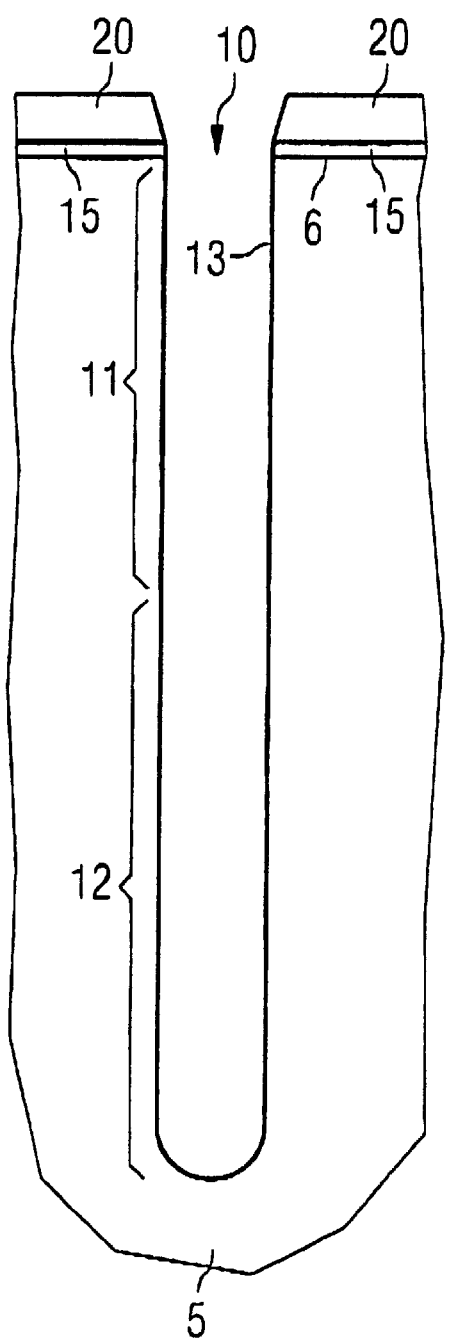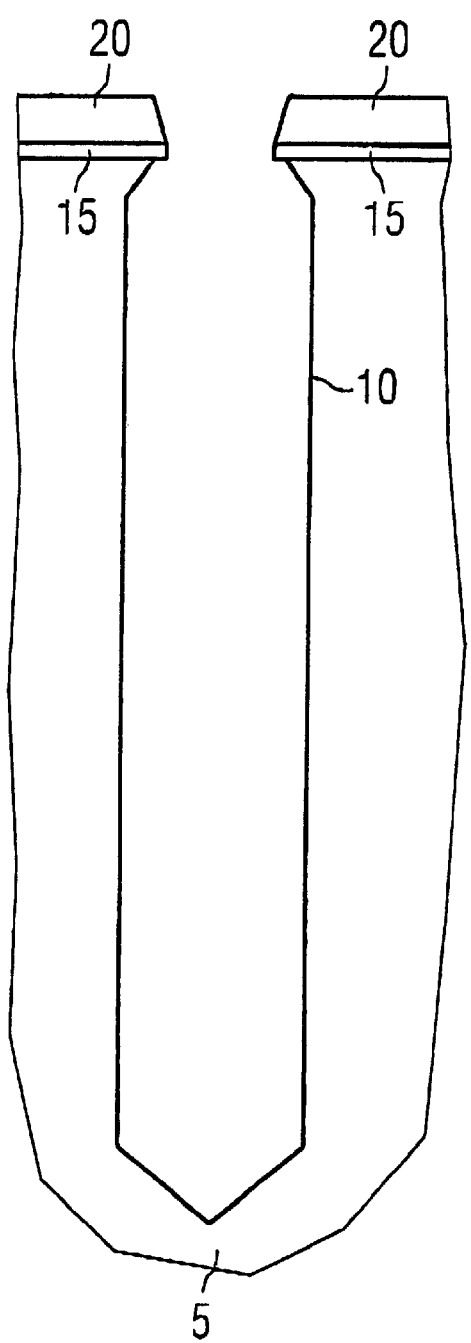

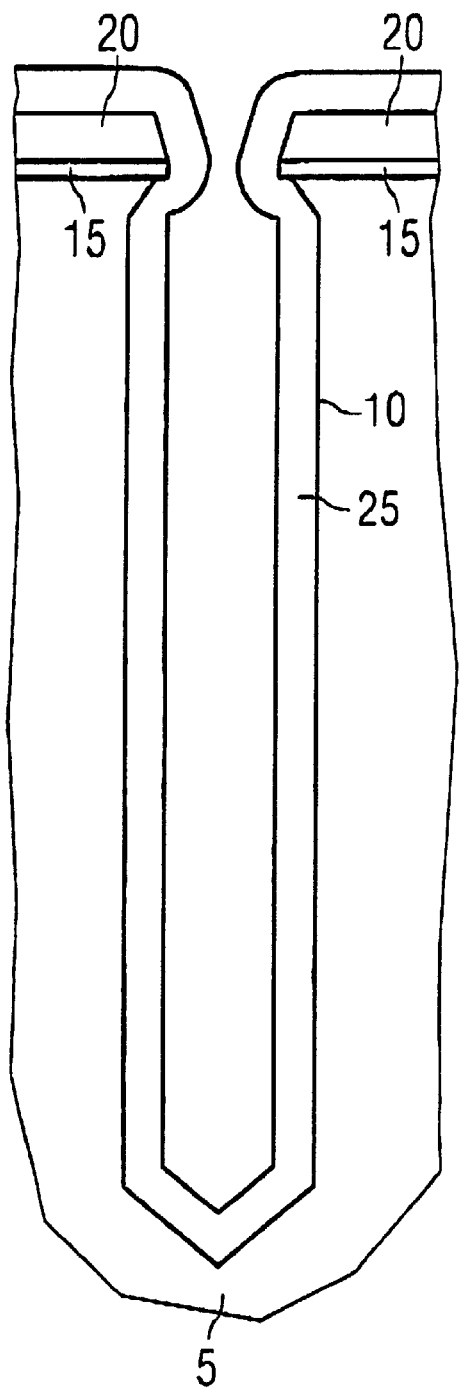
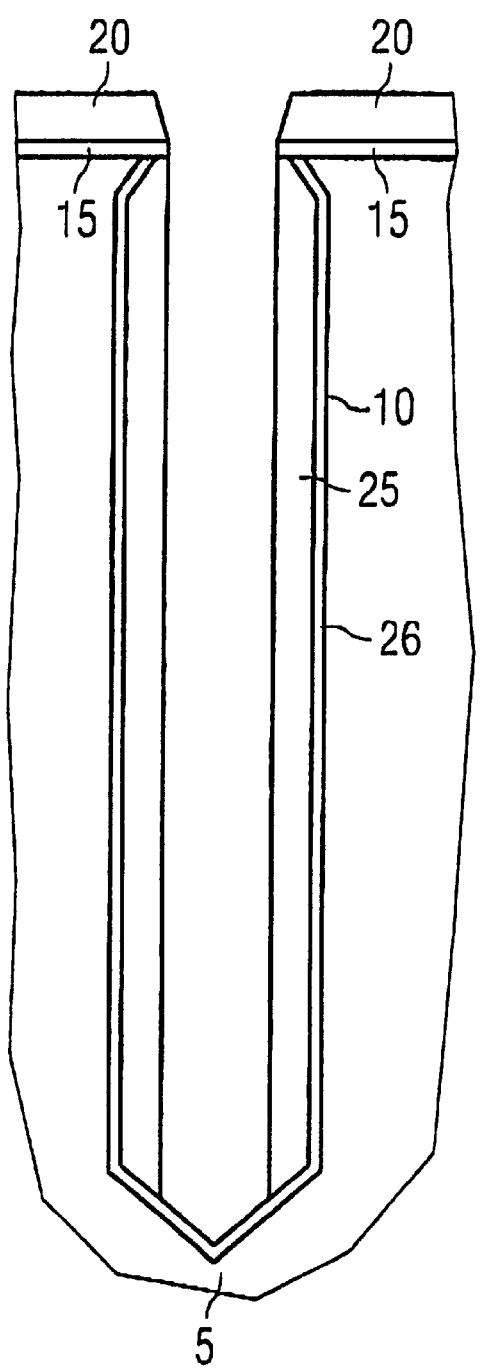

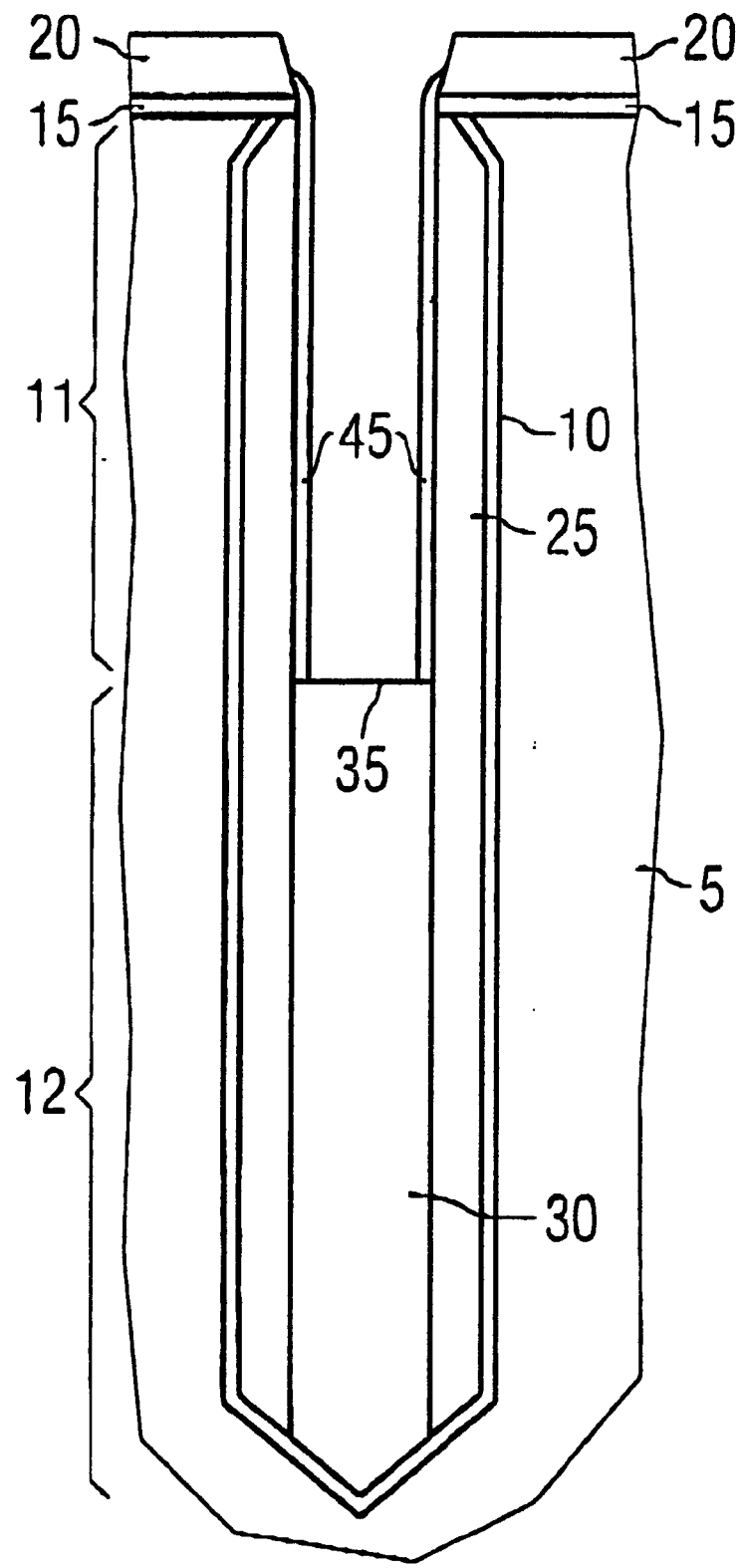

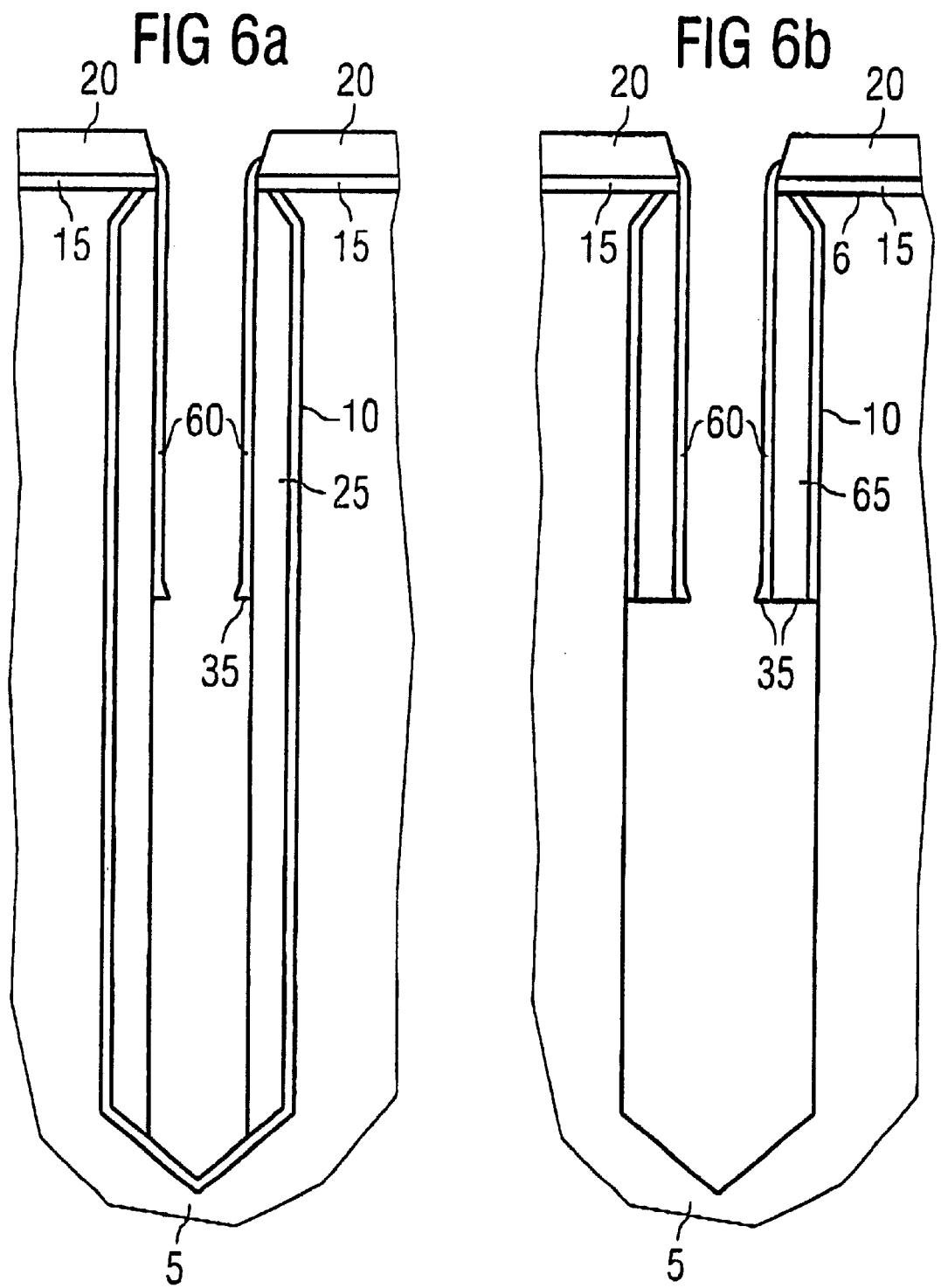

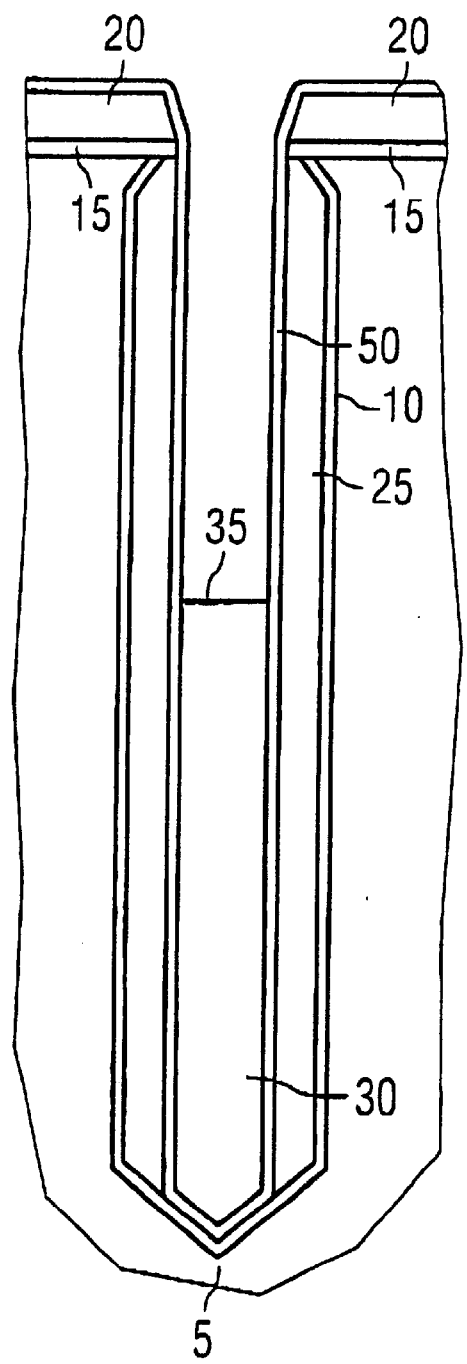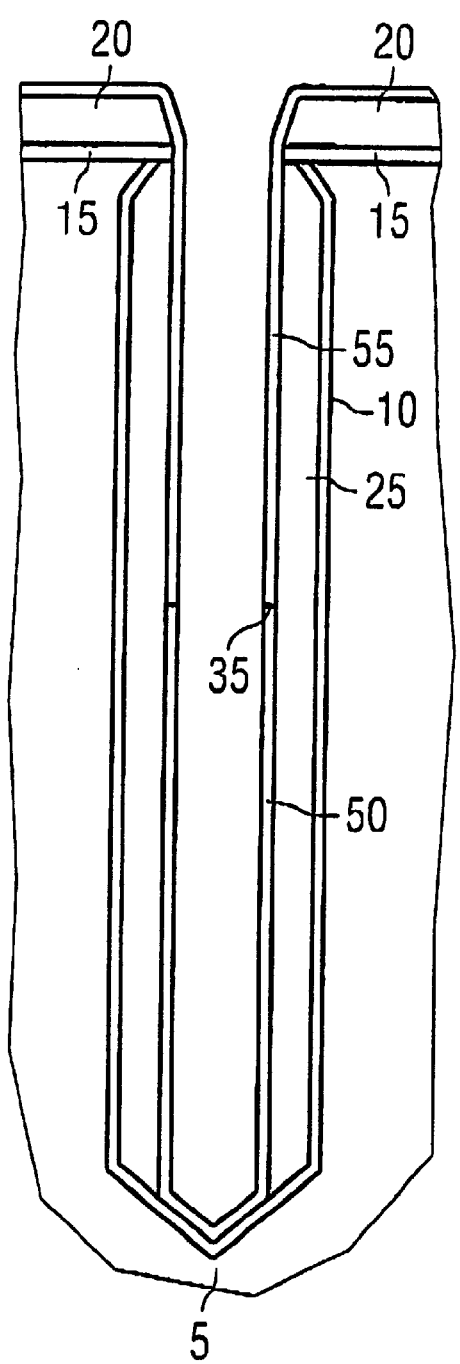

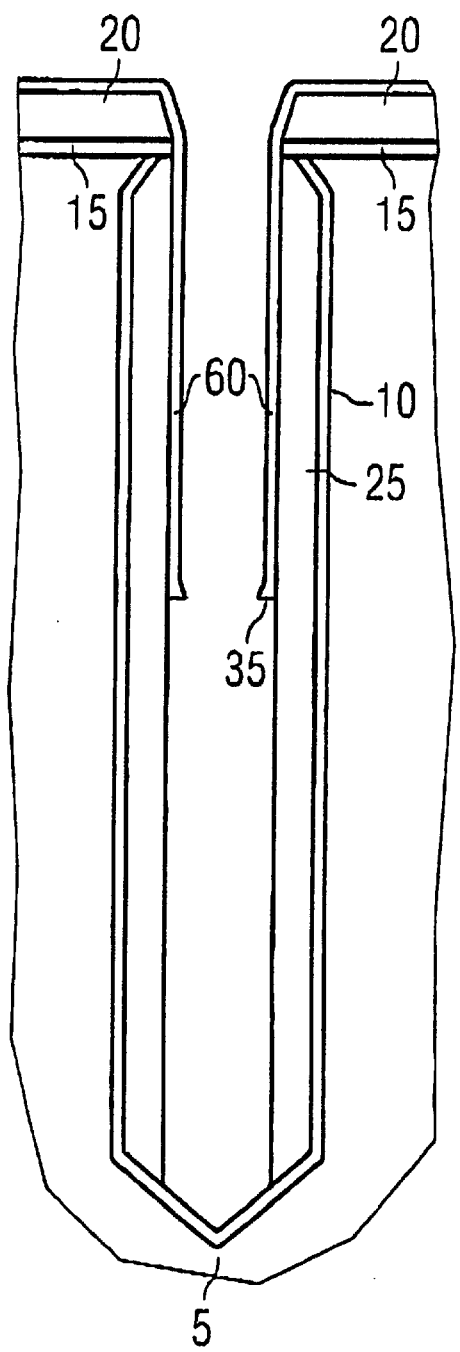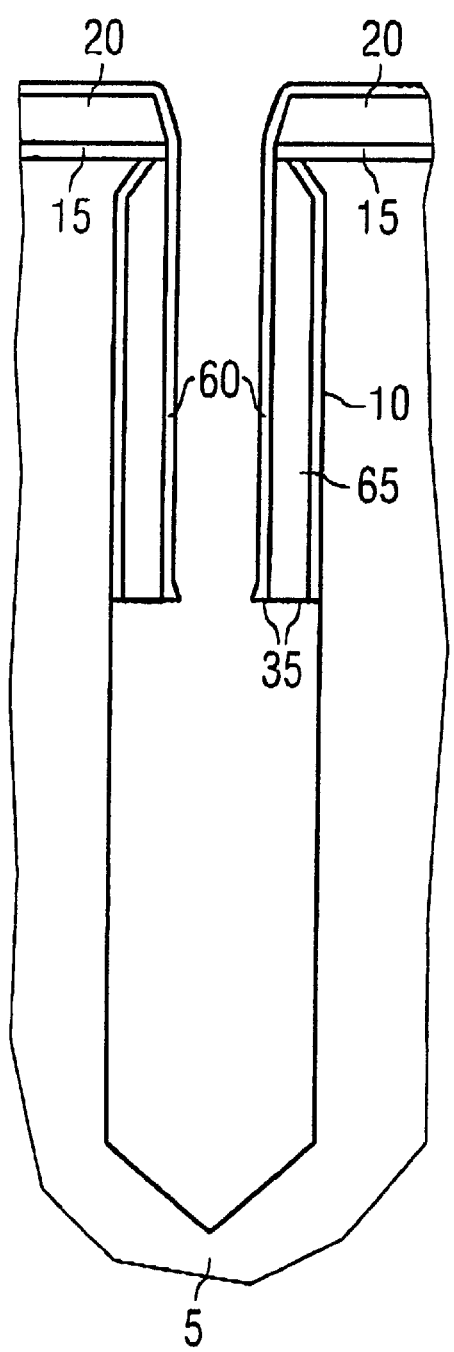

METHOD FOR MANUFACTURING A TRENCH CAPACITOR OF A MEMORY CELL OF A SEMICONDUCTOR MEMORY

BACKGROUND OF THE INVENTION

Field of the Invention

The invention lies in the semiconductor and memory technology fields. More specifically, the invention pertains to a method for manufacturing a trench capacitor that can be a component of a memory cell of a semiconductor memory.

Semiconductor memories, such as for example DRAMs (Dynamic Random Access Memories), are made up of a cell field and peripheral drive control equipment. Individual memory cells are situated in the cell field.

A DRAM chip contains a matrix of memory cells that are arranged in the form of rows and columns, and are controlled by word lines and bit lines. The reading out of data from the memory cells, or the writing of data to the memory cells, is accomplished through the activation of suitable word lines and bit lines.

Conventionally, a memory cell of a DRAM contains a transistor that is connected with a capacitor. Among other things, the transistor is made up of two diffusion regions that are separated from one another by a channel that is controlled by a gate. One diffusion region is called the drain region, and the other diffusion region is called the source region.

One of the diffusion regions is connected with a bit line, the other diffusion region is connected with a capacitor, and the gate is connected with a word line. Through application of suitable voltages to the gate, the transistor is controlled in such a way that a flow of current between the diffusion regions through the channel is switched on and switched off.

Due to the progressive miniaturization of memory components, the integration density is continually being increased. The continual increasing of the integration density means that the surface available per memory cell is constantly decreasing. This has the result that the selection transistor and the storage capacitor of a memory cell are subjected to a constant reduction in their geometrical dimensions.

The continuing effort towards miniaturization of memory devices promotes the design of DRAMs having greater density and smaller characteristic size, i.e., smaller memory cell surface. In order to manufacture memory cells that require a smaller surface area, smaller components, such as for example capacitors, are used. However, the use of smaller capacitors results in a lower storage capacity of the individual capacitor, which in turn can have an adverse effect on the functional capability and applicability of the memory device. For example, read amplifiers require a sufficient signal level for the reliable reading out of the information stored in the memory cells. The ratio of storage capacity to bit line capacity is decisive in the determination of the signal level. If the storage capacity becomes too small, this ratio can be too small to produce a sufficient signal for the controlling of the read amplifier. Likewise, a smaller storage capacity requires a higher refresh frequency. An additional disadvantage of a capacitor that has been reduced in its geometrical dimensions is to be found in the electrical supply lines, which are likewise fashioned with a reduced cross-section, through which the resistance of the supply lines is increased and the speed of the individual memory cell is reduced.

According to U.S. Pat. No. 5,744,386 it is known to produce a selective epitaxial layer on an exposed lateral wall in trench capacitors for the formation of a vertical selection transistor.

According to U.S. Pat. No. 6,066,527, it is known, for example, to produce an insulating collar in an upper region of a trench.

SUMMARY OF THE INVENTION

It is accordingly an object of the invention to provide a method of fabricating a trench capacitor of a memory cell of a semiconductor memory, which overcomes the above-mentioned disadvantages of the heretofore-known devices and methods of this general type and which provides for lower manufacturing costs and increased capacitance of the trench capacitor.

With the foregoing and other objects in view there is provided, in accordance with the invention, a method of manufacturing a trench capacitor, which comprises the following method steps:

providing a substrate with a substrate surface;

forming a trench with an upper region, a lower region, and a side wall in the substrate, the upper region being closer to the substrate surface than the lower region;

isotropically etching the trench to widen the trench in the upper region and the lower region;

conformally depositing a first insulating layer in the trench;

etching the first insulating layer with directed etching to form the first insulating layer as a lateral edge web;

removing the first insulating layer from the lower region of the trench, thereby forming an insulating collar in the upper region from the first insulating layer, the collar extending into the trench from the substrate surface down to a first sinking depth;

forming a capacitor dielectric on the substrate in the lower region of the trench and on the insulating collar in the upper region of the trench;

filling the trench with a conductive trench filling;

sinking the insulating collar into the trench down to a second sinking depth located between the substrate surface and the first sinking depth, and exposing the substrate on the side wall of the trench, above the second sinking depth;

sinking the conductive trench filling and the capacitor dielectric into the trench down to a third sinking depth located between the first sinking depth and the second sinking depth;

selective-epitaxially growing a selective epitaxial layer on the exposed side wall of the trench; and forming an electrical contact between the conductive trench filling and a doping region of a selection transistor. With the novel process there is formed a trench capacitor having a buried insulating collar and an epitaxial layer is formed, which is grown above the insulating collar in the trench, starting at the substrate. The buried insulating collar has the advantage that the trench capacitor is formed with a larger diameter than is provided by the lithographic mask used for its structuring. In this way, the trench capacitor is formed with a larger cross-sectional surface, which on the one hand enables a larger surface of the electrodes of the trench capacitor, through which the capacitance of the trench capacitor is increased, and on the other hand enables a larger cross-sectional surface for the conductive trench filling that forms the inner capacitor electrode of the trench capacitor and forms an electrical connection between the inner capacitor electrode B through the insulating sleeve formed by the insulating collar B to a doping region of a selection transistor. Through the enlarged cross-sectional surface of the conductive trench filling in the tubular insulating jacket formed by the insulating collar, a reduced electrical resistance is enabled, through which the time required for reading out and for storing an item of information in the trench capacitor can be reduced. The inventive combination of the buried insulating collar with a selective epitaxial layer grown above the insulating collar in the trench makes it possible to form the selection transistor of the memory cell closer to the trench capacitor, thus reducing the overall surface claimed by the memory cell. In this way, leakage currents between adjacent contact regions are likewise reduced.

An advantageous construction of the inventive method provides that a masking layer is situated on the substrate surface, and the directed etching of the first insulating layer is carried out selectively to the masking layer with etching gas containing carbon fluoride, such as $C_4F_8$, $C_5F_8$, or $C_2F_6$. Through the described etching with the named etching gases, the first insulating layer is formed in the trench as a lateral edge web. Because a widening of the trench was previously carried out, the masking layer blocks or screens the side wall of the trench, so that the insulating layer remains on the side wall of the trench during the directed etching.

A further construction of the inventive method provides that with the first insulating layer an oxidation step is carried out, at a temperature between 900° C. and 1050° C., for a duration between 20 and 90 minutes, in an atmosphere containing oxygen and/or nitrogen, in order to seal the first insulating layer.

This method step is suitable for the sealing of an insulating layer deposited by means of a CVD (Chemical vapor Deposition) or LPCVD (Low Pressure CVD) process, through which leakage currents through the insulating layer and at its boundary surface are reduced.

A further method step provides that an etching mask is formed in the upper region of the trench on the insulating layer, said mask being used as an etching mask in the removal of the insulating layer from the lower region of the trench. The etching mask is formed in the upper region of the trench in order to cover the first insulating layer there during an etching, and to protect it from the etching substance. During the etching, the first insulating layer is then removed from the lower region of the trench, while it remains in the upper region of the trench. In this way, the insulating collar is structured out of the first insulating layer and is formed in the upper region of the trench.

A further method step provides that in the trench, a first trench filling is deposited on the first insulating layer and is sunk into the trench up to a first sinking depth, whereby the first trench filling is removed from the upper region of the trench, and a conformal masking layer is deposited in the upper region of the trench on the first insulating layer and on the first trench filling, and is isotropically etched back, whereby lateral edge webs are formed on the first insulating layer that are used as an etching mask for the removal of the first insulating layer from the lower region of the trench. This method at first forms a first trench filling that is sunk into the trench up to a first sinking depth. Above the first trench filling, a masking layer is applied in conformal fashion on the first insulating layer and on the trench filling. The masking layer is subsequently etched with a directed etching step, through which the masking layer is formed as a lateral edge web (spacer) on the first insulating layer, above the first trench filling. The lateral edge webs are now subsequently used as an etching mask in order to protect the first insulating layer in the upper region of the trench, while the first insulating layer is removed from the lower region of the trench.

A further method step provides that in the trench a masking layer is deposited in conformal fashion on the first insulating layer and in the trench, a first trench filling is brought in on the masking layer and is sunk into the trench up to a first sinking depth, whereby the first trench filling is removed from the upper region of the trench, and the masking layer situated above the first sinking depth on the first insulating layer is converted into a modified masking layer through the bringing in of dopant on its surface, and the first trench filling is removed selectively to the modified masking layer from the lower region of the trench, and the masking layer is removed selectively to the modified masking layer from the lower region of the trench, and the modified masking layer is used as an etching mask for the removal of the first insulating layer from the lower region of the trench. This is a further method variant, involving the formation of an etching mask in the upper region of the trench on the first insulating layer, so that the first insulating layer can be removed from the lower region of the trench, while it remains in the upper region of the trench. For this purpose, first a conformal masking layer is deposited in the upper region and in the lower region of the trench on the first insulating layer. Subsequently, the first trench filling is filled in the trench and is sunk into the trench up to the first sinking depth. Here, the masking layer in the lower region of the trench is covered by the first trench filling, and is exposed in the upper region of the trench above the first sinking depth. Subsequently, the masking layer is converted through the bringing in of dopant at its surface. As a p-dopant, for example boron, indium, or gallium can be used, and as an n-dopant phosphorus, arsenic, and antimony are suitable, as well as oxygen or nitrogen.

Subsequently, the first trench filling is removed selectively to the modified masking layer from the lower region of the trench. Because the masking layer in the lower region of the trench has a different doping than does the modified masking layer in the upper region of the trench, the masking layer can likewise be removed selectively to the modified masking layer from the lower region of the trench. Subsequently, the modified masking layer acts as an etching mask in the removal of the first insulating layer from the lower region of the trench.

If, for example, an amorphous silicon layer is used as a masking layer, this layer can be doped with boron by means of a plasma doping. Subsequently, the first trench filling, made up for example of photoresist, is removed from the lower region of the trench. Subsequently, the removal of the masking layer can take place selectively to the modified masking layer doped with boron, by means of a KOH etching.

A further method step provides that a buried plate is formed around the lower region of the trench, whereby dopant is brought into the substrate. This is possible for example by means of a gas phase doping with arsenic or phosphorus. The buried plate acts as an outer capacitor electrode of the trench capacitor, and may be electrically connected with other buried plates of adjacent trench capacitors via a buried layer, to form a common counter-electrode.

A further method step provides that a capacitor dielectric is formed in the lower region of the trench on the substrate and in the upper region of the trench on the insulating collar. The capacitor dielectric is used as an insulating layer between the two capacitor electrodes of the trench capacitor, which form the outer capacitor electrode of the buried plate. A further construction of the inventive method provides that the conductive trench filling is sunk up to the second sinking depth, and subsequently the capacitor dielectric is etched isotropically, whereby it is etched back up to the second sinking depth, and subsequently the insulating collar is etched isotropically, whereby this collar is etched back up to the second sinking depth, and subsequently the conductive trench filling is sunk in up to the third sinking depth, and subsequently the capacitor dielectric is isotropically etched, whereby it is etched back up to the third sinking depth.

The specified method steps form a structure wherein the conductive trench filling and the capacitor dielectric are sunk into the trench up to the third sinking depth, and the first insulating layer is sunk into the trench up to the second sinking depth. The second sinking depth is thereby situated between the first sinking depth and the substrate surface, and the third sinking depth is situated between the first sinking depth and the second sinking depth. This has the advantage that the subsequently grown selective epitaxy grows for example only on the side wall of the trench above the second sinking depth, which is situated at a distance from the third sinking depth, and thus from the filling height of the conductive trench filling.

A further method step provides that a contact layer is formed in the trench on the conductive trench filling. The contact layer has the advantage that it prevents an epitaxial growth on the contact layer, and thus on the conductive trench filling, in the subsequent selective epitaxy. Through this, for example a polycrystalline growth is avoided.

A further method step provides that an intermediate layer is formed on the selectively grown epitaxial layer. The intermediate layer has the advantage that the monocrystalline substrate and the epitaxially grown layer can be protected from crystal imperfections which could otherwise progress out of the trench into the substrate, and could result in damage to the selection transistor.

A further method step provides that a process step is carried out at a temperature between 900° C. and 1050° C. in an atmosphere containing hydrogen, at a pressure of approximately 20 Torr (2666 Pascal), whereby crystal defects are reduced in the epitaxially grown layer.

The process step can also be carried out at a temperature between 500° C. and 900° C., at a pressure of less than $10^{-8}$ Torr, whereby the selective epitaxy is carried out in UHV (ultra-high vacuum).

Other features which are considered as characteristic for the invention are set forth in the appended claims.

Although the invention is illustrated and described herein as embodied in a method for manufacturing a trench capacitor of a memory cell of a semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic partial side view of a substrate formed with a trench having an upper region and a lower region;

FIG. 2 shows the effects of a method step that widens the trench and thus enlarges the trench diameter;

FIG. 3 shows the trench from FIG. 2 with a first insulating layer;

FIG. 4 shows the trench from FIG. 3 after execution of a directed etching for the formation of a lateral edge web from the first insulating layer;

FIGS. 6, 6a, and 6b show the trench from FIG. 5, whereby lateral edge webs have been etched from the conformal masking layer in the upper region of the trench by means of a directed etching, said webs being used as an etching mask for the removal of the first insulating layer from the lower region of the trench;

FIG. 7 shows the trench from FIG. 4, whereby a masking layer has been deposited in conformal fashion in the upper and in the lower region of the trench, and the lower region of the trench has been filled with a first trench filling;

FIG. 8 shows the trench from FIG. 7 after conversion of the upper region of the masking layer into a modified masking layer, and after removal of the first trench filling from the lower region of the trench;

FIG. 9 shows e trench according to FIG. 8, whereby an etching mask has been formed from the modified masking layer in the upper region of the trench;

FIG. 10 shows the trench according to FIG. 9, whereby the first insulating layer has been removed from the lower region of the trench by means of the etching mask;

DESCRIPTION OF THE PREFERRED EMBODIMENTS

Figure 5:
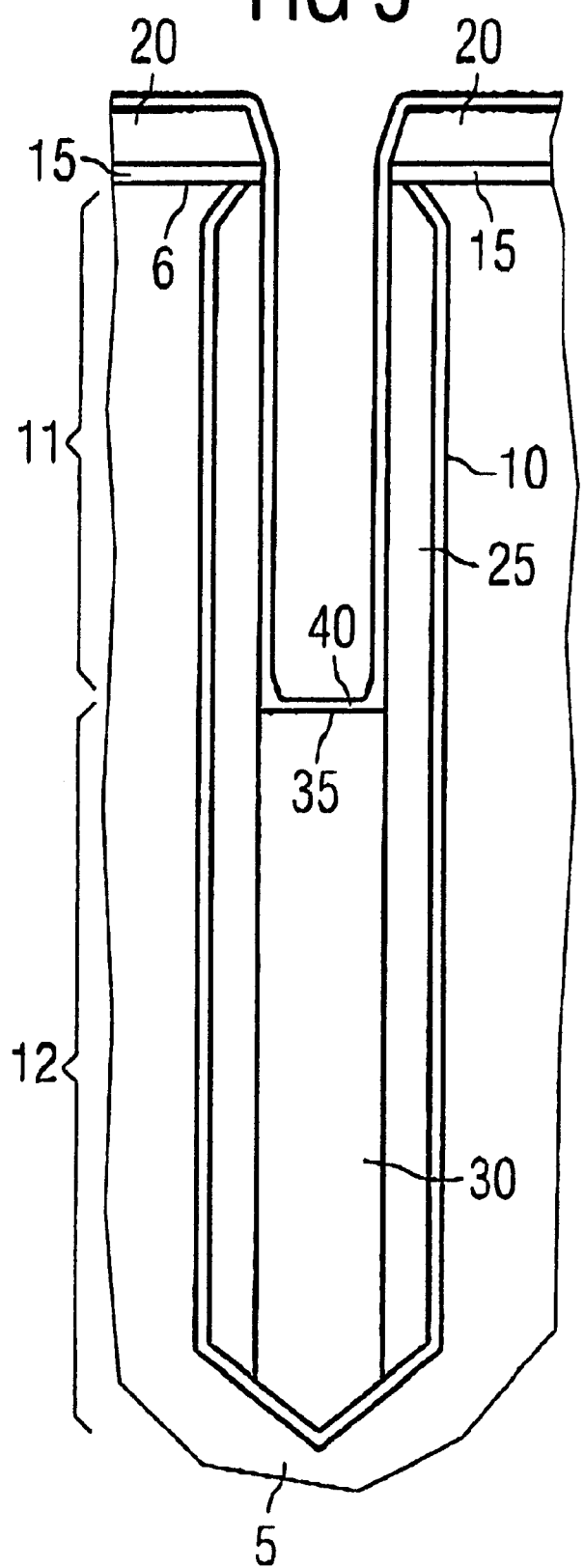
FIG. 5 shows the trench from FIG. 4 with a first trench filling in the lower region of the trench, and a conformal masking layer in the upper region of the trench.

Referring now to the figures of the drawing in detail and first, particularly, to FIG. 1 thereof, and subsequently to the further temporally sequential views, a substrate 5 is shown that has a substrate surface 6. A first masking layer 15 and a second masking layer 20 are situated on the substrate surface 6. A trench 10 is formed in the substrate 5. The trench 10 has an upper region 11 and a lower region 12. In addition, trench 10 has a side wall 13. Substrate 5 is for example formed from silicon; first masking layer 15 and second masking layer 20 include, independent of one another, e.g. silicon nitride or silicon oxide. For the formation of trench 10 in substrate 5, for example first masking layer 15, second masking layer 20, and additional masking layers, such as for example a hard mask, are arranged on masking layer 20. The hard mask, or masking layers 15 and 20, are structured by means of a photolithographic step and a subsequent etching step, and are subsequently used for the formation of trench 10 during an etching step. Subsequently, hard mask 10 is removed from second masking layer 20.

With reference to FIG. 2, an isotropic (undirected) etching step is executed through which trench 10 is widened. The widening of the trench can for example be carried out with ammonium hydroxide ($NH_4OH$) or KOH, whereby the diameter of the trench is enlarged in upper region 11 and in lower region 12. For example, through the widening of the trench a silicon layer can be removed from the side wall of trench 13 whose thickness is between 5 nm and approximately 50 nm B preferably a silicon layer whose thickness is between 15 nm and 30 nm B through which the widening of the trench is formed.

With reference to FIG. 3, subsequently a first insulating layer 25 is deposited. First insulating layer 25 is thereby deposited approximately conformally on masking layer 20 and in trench 10. The deposition can for example be carried out by means of a CVD (Chemical Vapor Deposition) or LPCVD (Low Pressure Chemical vapor Deposition) process, in order to form first insulating layer 25 in conformal fashion.

With reference to FIG. 4, subsequently a directed etching step is executed wherein first insulating layer 25 is removed from second masking layer 20 and, for example, from the floor of the trench. This etching can for example be carried out with carbon fluorides such as $C_4F_8$, $C_5F_8$, or $C_2F_6$. If second masking layer 20 is formed from silicon nitride and first insulating layer 25 is formed from silicon oxide, then the directed etching with the named etching agents is selective to silicon nitride and it only attacks the first insulating layer 25.

Subsequently, for example additional cleaning steps can be carried out. In order to seal first insulating layer 25, deposited by means of a CVD or LPCVD method, through which its insulating properties are essentially improved, subsequently an oxide having a thickness of 5 nm and a subsequent temperature treatment at a temperature between 900° C. and 1050° C. can be carried out for a duration between 20 and 90 minutes in an atmosphere containing nitrogen. In this way, for example leakage currents along the boundary surface between the substrate and the first insulating layer are reduced. Here, there arises a silicon oxide layer 26 between the substrate 5 and the first insulating layer 25.

With reference to FIG. 5, subsequently a first trench filling 30 is deposited in trench 10 and on second masking layer 20, and is subsequently sunk into trench 30 up to a first sinking depth 35. For example, the first trench filling contains polysilicon or amorphous silicon, which can be doped with boron, phosphorous, or arsenic. The use of an amorphous silicon is hereby preferred. Typically, first sinking depth 35 has a distance of 1 to 2 $\mu$m from substrate surface 6. A distance of between 1.1 and 1.5 $\mu$m is preferred.

Optionally, an additional liner made of amorphous silicon can be deposited in the trench.

Subsequently, a conformal masking layer 40 is deposited in upper region 11 of trench 10 on first trench filling 30. For conformal masking layer 40, a material is selected that is suitable as an etching mask for first insulating layer 25. If first insulating layer 25 is for example formed from silicon oxide, then conformal masking layer 40 can be formed by means of a thermal nitridization of first insulating layer 25 in upper region 11 of trench 10. It is likewise possible to carry out a plasma-supported nitridization of first insulating layer 25. A further variant provides that a silicon nitride layer is deposited in conformal fashion.

With reference to FIG. 6, subsequently a directed etching step is carried out wherein the conformal masking layer is fashioned as a lateral edge web 45. Here conformal masking layer 40 is removed from second masking layer 20 and from first trench filling 30 by means of a directed etching. The directed etching can for example be carried out by means of reactive ion etching.

Subsequently, first trench filling 30 is removed from lower region 12 of trench 10. This is shown in FIG. 6a. With reference to FIG. 6a, an etching mask 60 is now formed in upper region 11 of trench 10 on first insulating layer 25. Etching mask 60 thereby extends from substrate surface 6 up to first sinking depth 35.

With reference to FIG. 6b, first insulating layer 25 is removed selectively to etching mask 60 from lower region 12 of trench 10 by means of an etching, whereby an insulating collar 65 is formed from first insulating layer 25, said collar extending from substrate surface 6 up to first sinking depth 35 in upper region 11 of trench 10.

With reference to FIGS. 7, 8, 9, and 10, a further method variant is described with which the at first conformally deposited first insulating layer 25 can be removed from lower region 12 of trench 10, and is left untouched in upper region 11 of trench 10 as insulating collar 65. In the process sequence, FIG. 7 follows FIG. 4, whereby at first a masking layer 50 is deposited conformally in upper region 11 and in lower region 12 of trench 10. Subsequently, the trench is filled with a first trench filling 30, which is at first also situated on second masking layer 20, and is sunk into trench 10 up to a first sinking depth 35 by means of a sinking process. Through this, masking layer 50 in lower region 12 of trench 10 is covered by first trench filling 30, and is not covered in upper region 11 of trench 10.

With reference to FIG. 8, a doping of masking layer 50 is now carried out, whereby in upper region 11 of trench 10 bare masking layer 50 is converted into a modified masking layer 55, and masking layer 50 remains unmodified in lower region 12 of trench 10. The doping can for example be carried out by means of arsenic, phosphorus, or boron, or nitrogen or oxygen. Subsequently, first trench filling 30 is removed from lower region 12 of trench 10, whereby modified masking layer 55 remains as an etching mask 60 in upper region 11 of trench 10. Subsequently, masking layer 50 is removed from lower region 12 of trench 10.

With reference to FIG. 9, an etching mask 60 is now formed in upper region 11 of trench 10 on first insulating layer 25 and on second masking layer 20. Etching mask 60 thereby extends up to first sinking depth 35 in trench 10.

With reference to FIG. 10, first insulating layer 25 is removed selectively to etching mask 60 from lower region 12 of trench 10 by means of an etching, whereby an insulating collar 65 is formed from first insulating layer 25, the collar extending from substrate surface 6 up to first sinking depth 35 in upper region 11 of trench 10.

Figure 11:
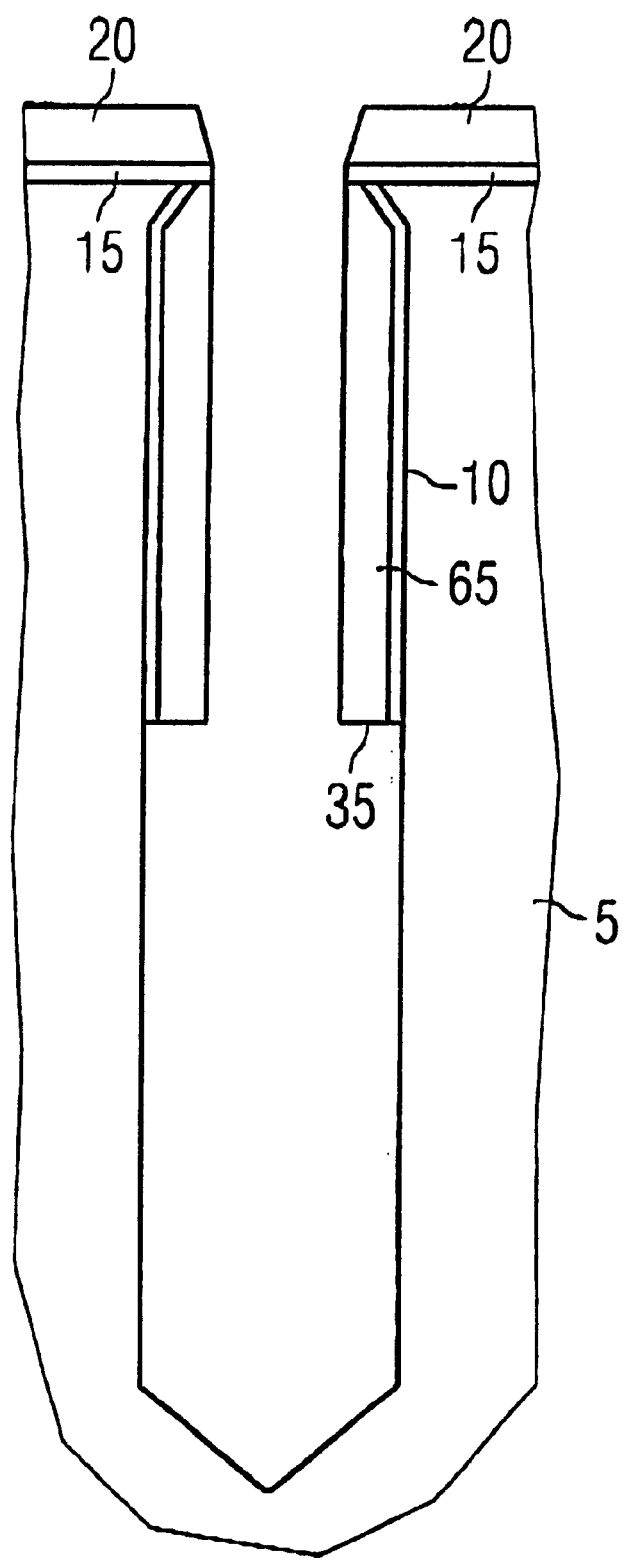
FIG. 11 shows the trench according to FIG. 6b, or according to FIG. 10, whereby the etching mask has been removed from the insulating layer in the upper region of the trench.

With reference to FIG. 11, subsequently etching mask 60 is removed from insulating collar 65, or also from second masking layer 20, by means of a selective etching.

Figure 12:
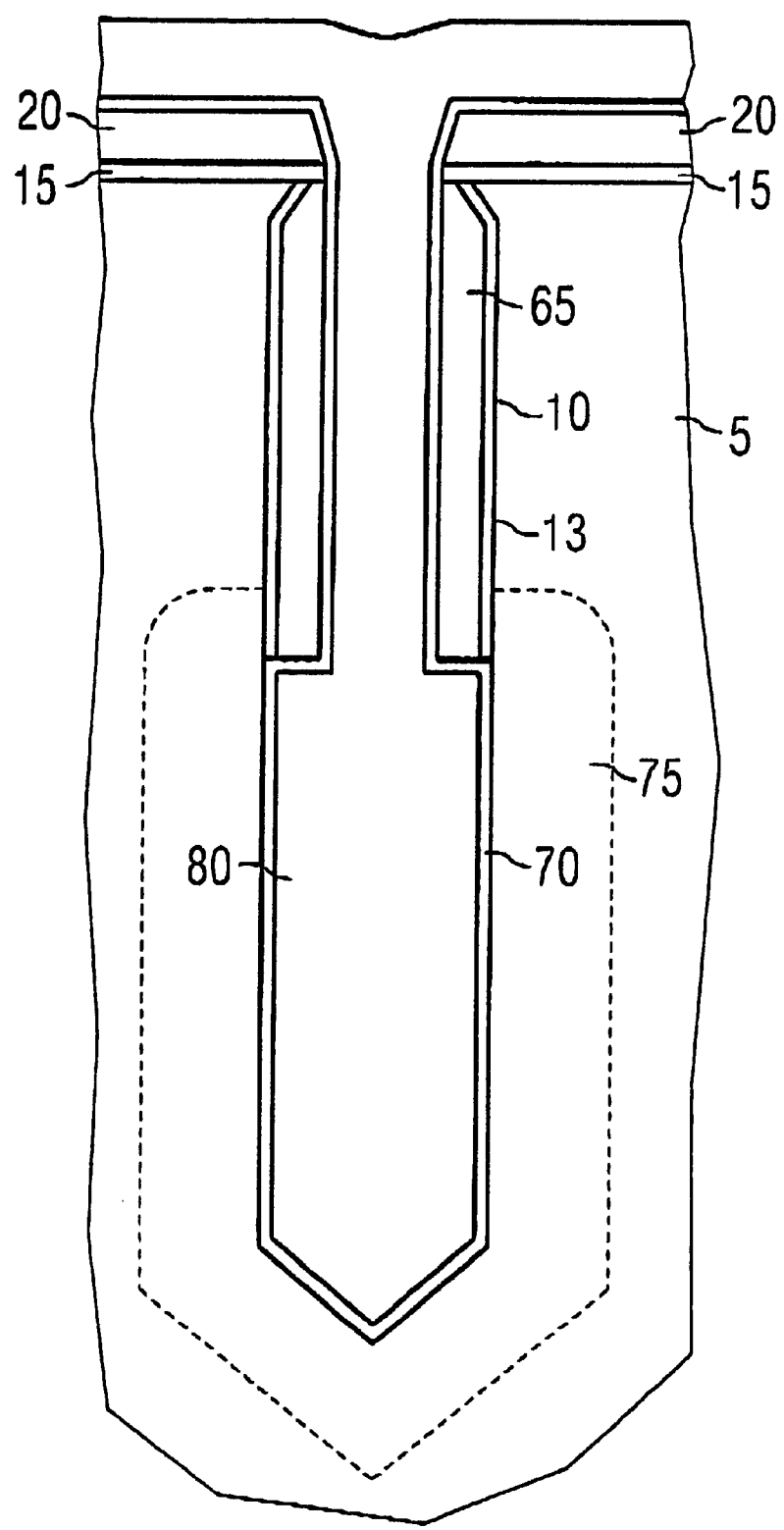
FIG. 12 shows the trench from FIG. 11, whereby a buried plate has been brought into the substrate, and the trench has been lined with a capacitor dielectric and filled with a conductive trench filling.

With reference to FIG. 12, a buried plate 75 is now optionally formed around lower region 12 of trench 10. This is for example possible by means of a gas-phase doping with arsenic, or phosphorus. Here, $AsH_3$ or $PH_3$ can also be used as doping gases.

Subsequently, capacitor dialectic 70 is formed in trench 10. Capacitor dialectic 70 is thereby formed in lower region 12 of trench 10, on the side wall of trench 13, on substrate 5. In upper region 11 of trench 10, capacitor dialectic 70 is formed on insulating collar 65. Capacitor dialectic 70 can for example contain doped or undoped silicon nitride, silicon oxide, or silicon oxynitride. Likewise, capacitor dielectric 70 can be formed as a layer stack made up of silicon oxide, aluminum oxide, and silicon oxide. In addition, it is possible to form the capacitor dialectic, made up of silicon nitride and aluminum oxide. Before capacitor dialectic 70 is applied in lower region 12 of trench 10 on substrate 5, a metallic layer can be deposited that contains tungsten or tungsten nitride. Subsequently, a conductive trench filling 80 is filled into trench 10. Conductive trench filling 80 contains, for example, polycrystalline or amorphous silicon, tungsten, or tungsten nitride.

Figure 13:
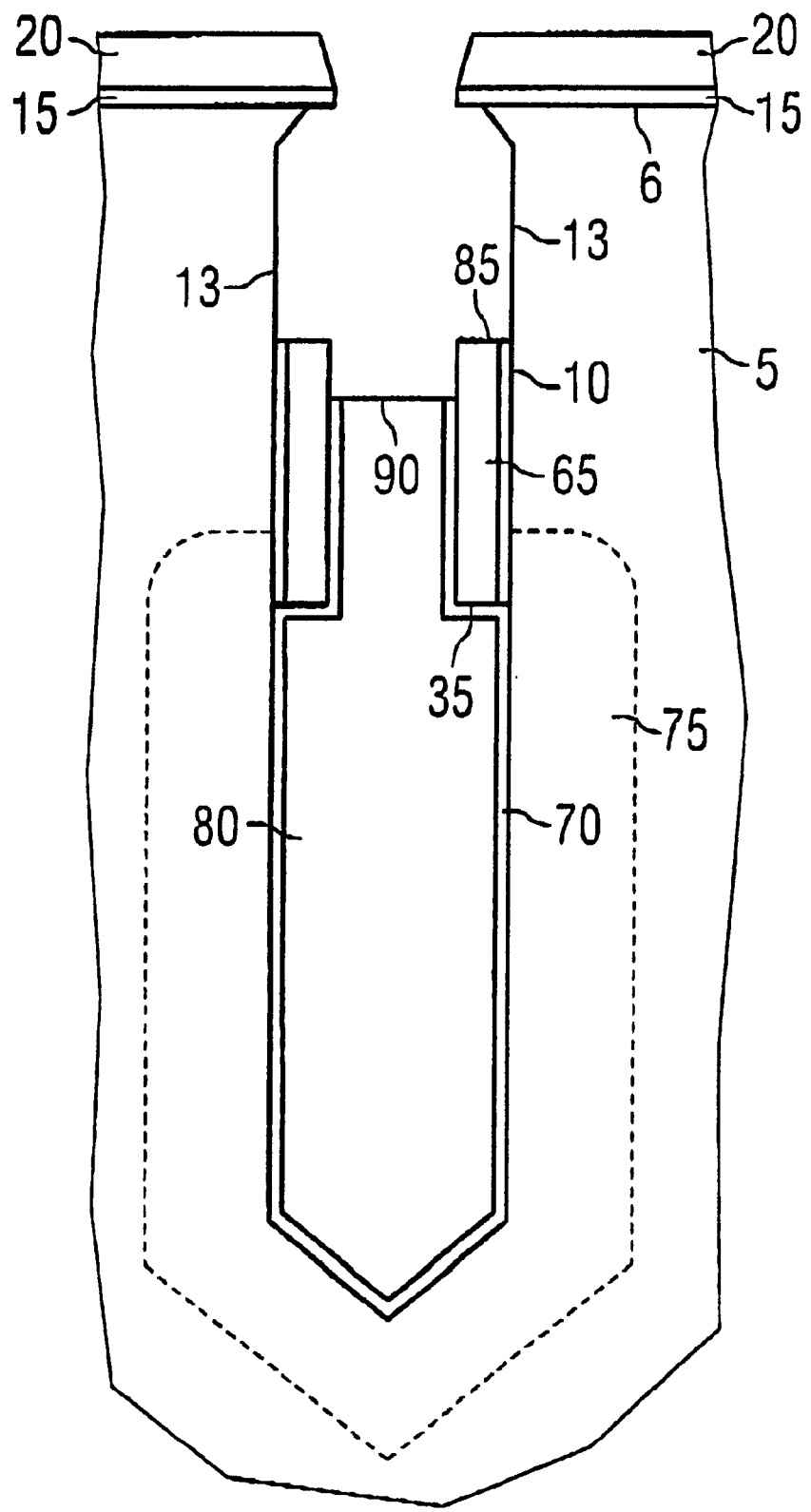
FIG. 13 shows the trench from FIG. 12, whereby the insulating collar, the conductive trench filling, and the capacitor dielectric are sunk into the trench, and the side wall of the trench, and thus the substrate, are exposed.

With reference to FIG. 13, conductive trench filling 80 is first sunk into trench 10 up to a second sinking depth 85, whereby second sinking depth 85 is situated between substrate surface 6 and first sinking depth 35. Subsequently, the capacitor dielectric exposed by this in upper region 11 of trench 10 is etched, whereby it is now likewise sunk into trench 10 up to second sinking depth 85. Insulating collar 65, now exposed, is now likewise sunk in up to second sinking depth 85 by means of an etching process. The etching processes are respectively executed selective to one another.

Optionally, conductive trench filling 80 is sunk into trench 10 up to a third sinking depth 90, whereby third sinking depth 90 is located between first sinking depth 35 and second sinking depth 85. With an isotropic etching step, capacitor dialectic 70 is likewise sunk into trench 10 up to third sinking depth 90.

Figure 14:
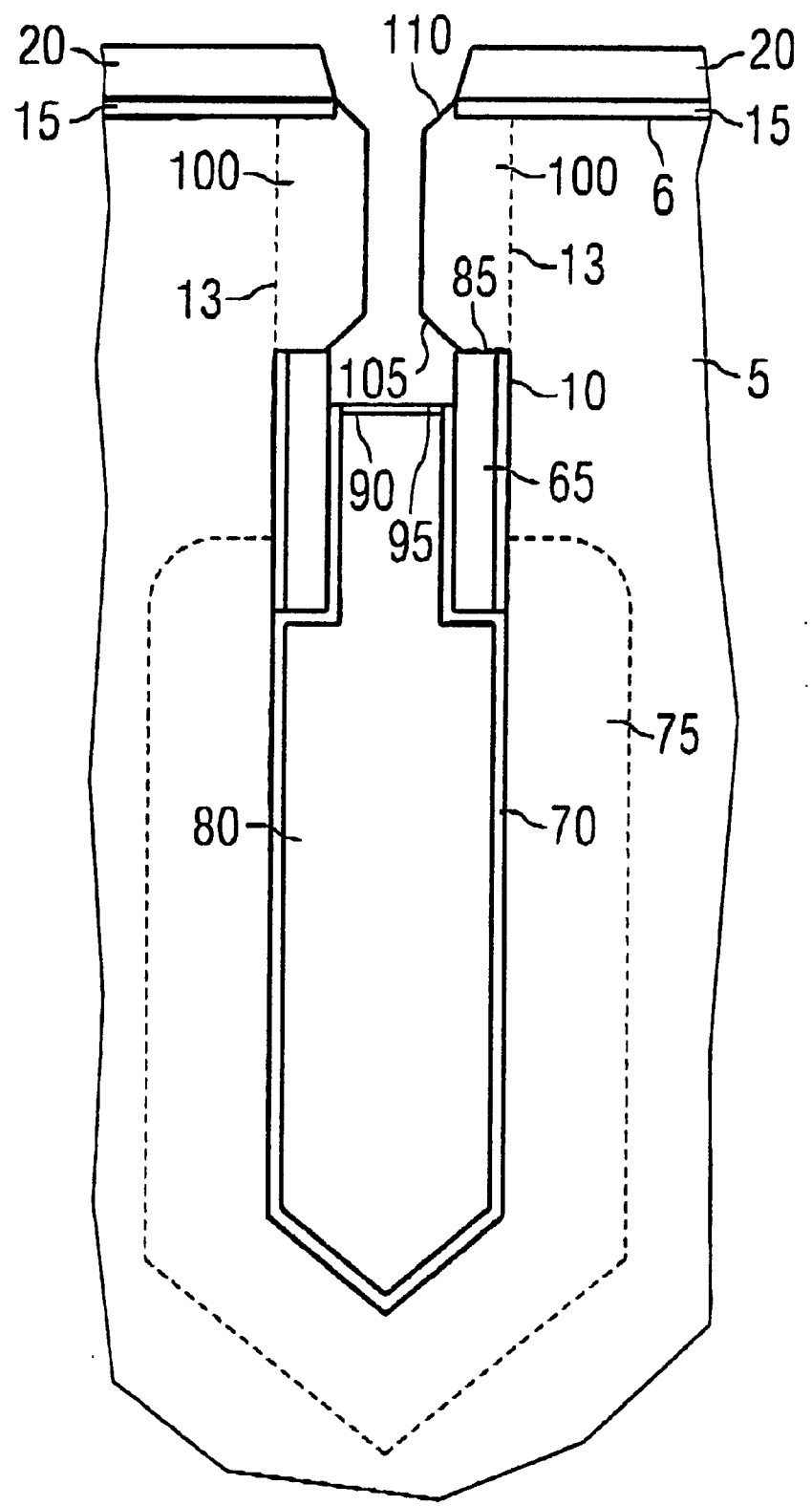
FIG. 14 shows the trench from FIG. 13, whereby a contact layer has been formed on he conductive trench filling, and a selective epitaxial layer has been grown in selective and epitaxial fashion on the substrate, on the exposed side wall of the trench.

With reference to FIG. 14, a contact layer 95 can now optionally additionally be formed on conductive trench filling 80, whereby contact layer 95 includes for example tungsten nitride, tungsten silicide, or titanium silicide. If conductive trench filling 80 is for example formed from polycrystalline silicon, then through contact layer 95 the spreading or propagation of crystal defects from conductive trench filling 80 out into a selection transistor is prevented.

Subsequently, a selective epitaxial layer is grown at a temperature between 850° C. and 950° C., in an atmosphere containing hydrogen. If conductive trench filling 80, not made of silicon, or a contact layer 95 not made of crystalline silicon, is situated on conductive trench filling 80, then an epitaxial layer 100 can be selectively grown, through which the silicon growth is carried out only on side wall 13 of trench 10 in upper region 11 of trench 10, above the second sinking depth, so that substrate 5 is exposed on these materials. The epitaxy is for example selective in relation to silicon nitride and silicon oxide, so that no layer growth takes place on these materials during the selective epitaxy. Selectively grown epitaxial layer 100 has for example an upper facet 110 in the vicinity of substrate surface 6, and a lower facet 105 in the vicinity of second sinking depth 85. Facets 105 and 110 are crystal orientation directions of the substrate.

Figure 15:
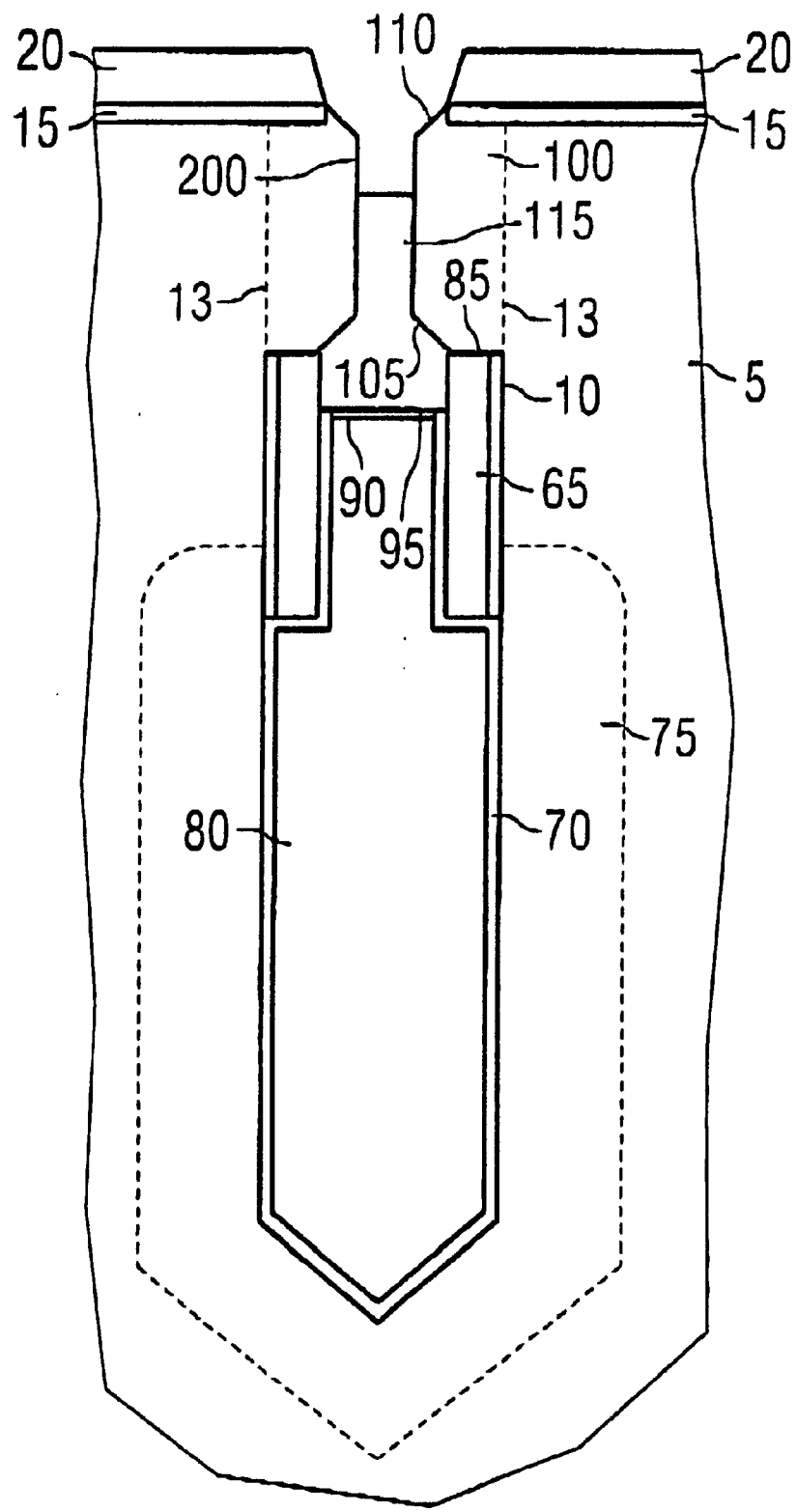
FIG. 15 shows the trench from FIG. 14, whereby a buried contact has been placed in the trench, on the conductive trench filling, next to the selective epitaxial layer.

With reference to FIG. 15, subsequently a buried contact 115 is brought into upper region 11 of trench 10, for the electrical connection of conductive trench filling 80 with selective epitaxial layer 100. Optionally, selective epitaxial layer 100 can be carried out by means of a gas-phase doping, a plasma doping, or a diffusion of dopant into selective epitaxial layer 100, starting from a doped buried contact 115. Buried contact 115 can for example be formed from polysilicon, amorphous silicon, or a metal such as tungsten, tungsten nitride, or titanium nitride. Subsequently, buried contact 115 is sunk into the trench.

Figure 16:
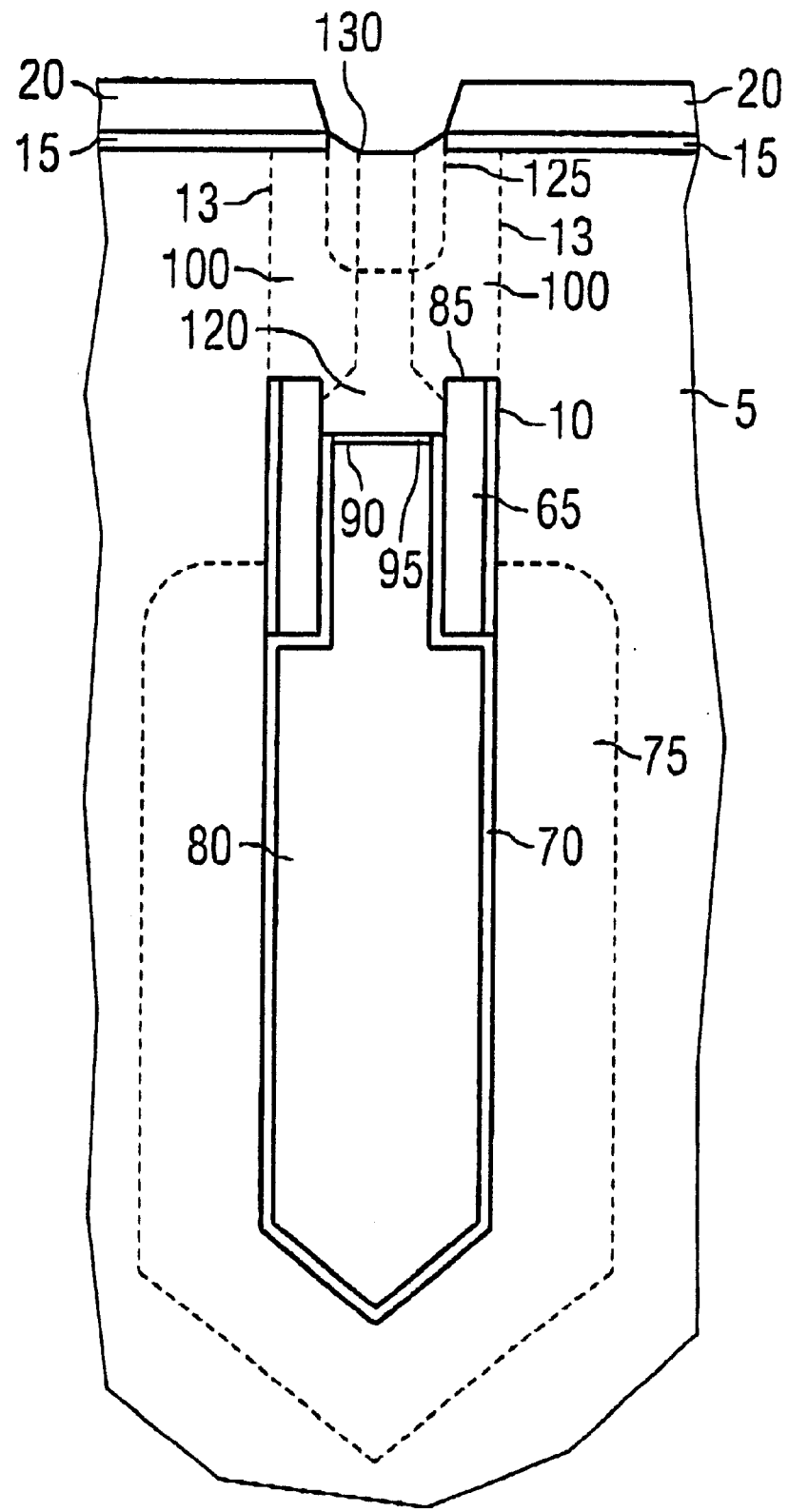
FIG. 16 shows the trench according to FIG. 13, whereby the selective epitaxial growth is continued until the growth fronts meet one another.

FIG. 16 illustrates an epitaxial growth of selective epitaxial layer 100 on the basis of FIG. 13. The growth is interrupted, and a reflow process is carried out wherein epitaxial layer 100, which is grown selectively and in monocrystalline fashion, is melted, and assumes a surface 125. The reflow process is for example carried out a temperature between 950° C. and 1050° C., in an atmosphere containing hydrogen, in order to melt the selectively grown silicon. The reflow process can likewise be carried out at temperatures <900° C. in an ultra-high vacuum, at a pressure of less than $10^{-8}$ Torr.

Subsequently, a second selective epitaxy is carried out, wherein the epitaxial layer having a surface 130 grows further.

Figure 17:
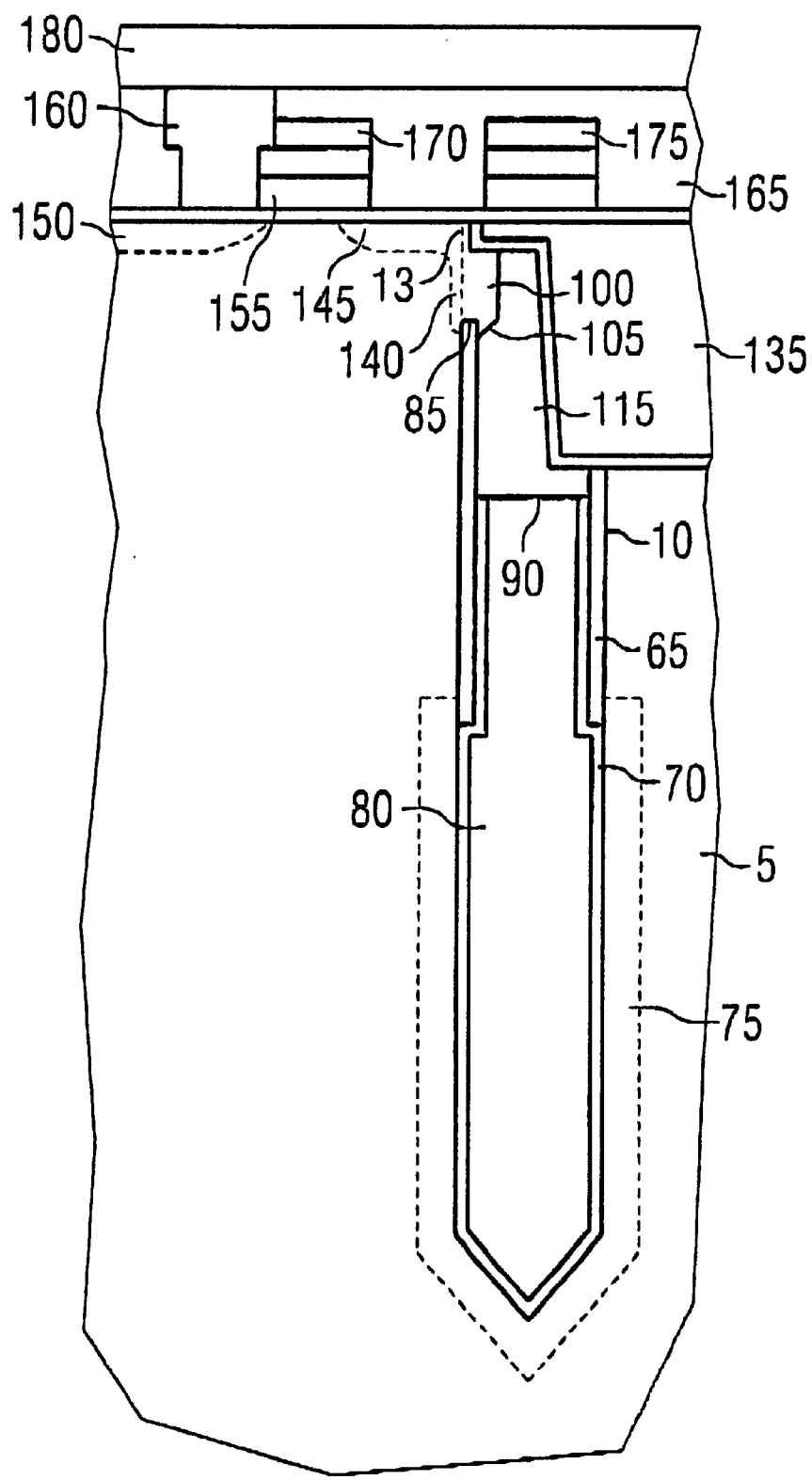
FIG. 17 shows a memory cell according to FIG. 15, having a planar selection transistor.

In FIG. 17, a memory cell having a trench capacitor according to FIG. 15 is shown, whereby a planar selection transistor is situated next to the trench capacitor. In addition to FIG. 15, an insulating trench 135 is arranged for the insulation of the trench capacitor from adjacent trench capacitors. The insulating trench is conventionally formed as an STI (Shallow Trench Isolation). In addition, a region 140 of diffusion of dopant is shown that forms an electrical connection between a first doping region 145 of the selection transistor, selective epitaxial layer 100, buried contact 115, and conductive trench filling 80. In addition, the selection transistor has a second doping region 150 that is connected to a bit line 180 with a bit line contact 160. The selection transistor is controlled by means of a gate 155 on which a word line 170 is situated. Next to word line 170, on insulating collar 135 a fitting word line 175 is shown. Word line 170, fitting word line 175, and bit line contact 160 are for example arranged in a second insulating layer 165 that is situated on substrate surface 6. The bit line 180 is, for example, situated on the first insulating layer 165.

Figure 18:
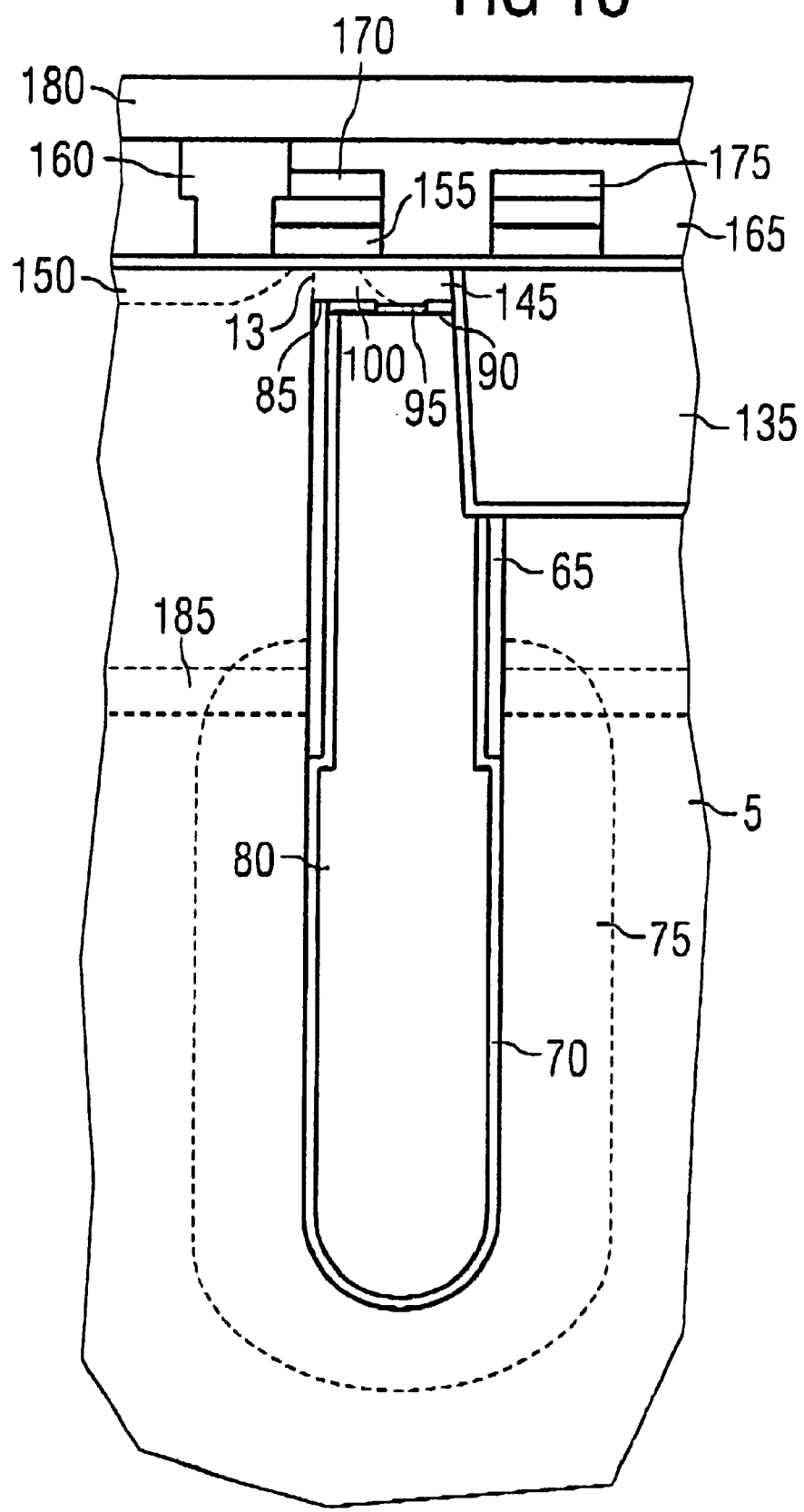
FIG. 18 shows a memory cell according to FIG. 16, having a selection transistor that is formed in perpendicular fashion over the trench capacitor.

With reference to FIG. 18, a further variant of a memory cell having a planar selection transistor is shown, whereby the planar selection transistor is situated in perpendicular fashion over the trench capacitor. This memory cell is also designated DOT (Device Over Trench). The memory cell shown in FIG. 18 includes the trench capacitor shown in FIG. 16. In addition, an insulating collar 135 is arranged for the insulation of the trench capacitor from adjacent capacitors. First doping region 145 of the selection transistor is connected, by means of dopant and contact layer 95, with conductive trench filling 80 of the trench capacitor. In addition, the selection transistor has a second doping region 150 that is connected, via a bit line contact 160, with bit line 180. The selection transistor is controlled with gate 155, which is connected to word line 170. Fitting word line 175 is situated on insulating trench 135 next to word line 170. Word line 170, gate 155, fitting word line 175, and bit line contact 160 are situated in second insulating layer 165, on which bit line 180 is situated.

Figure 19:
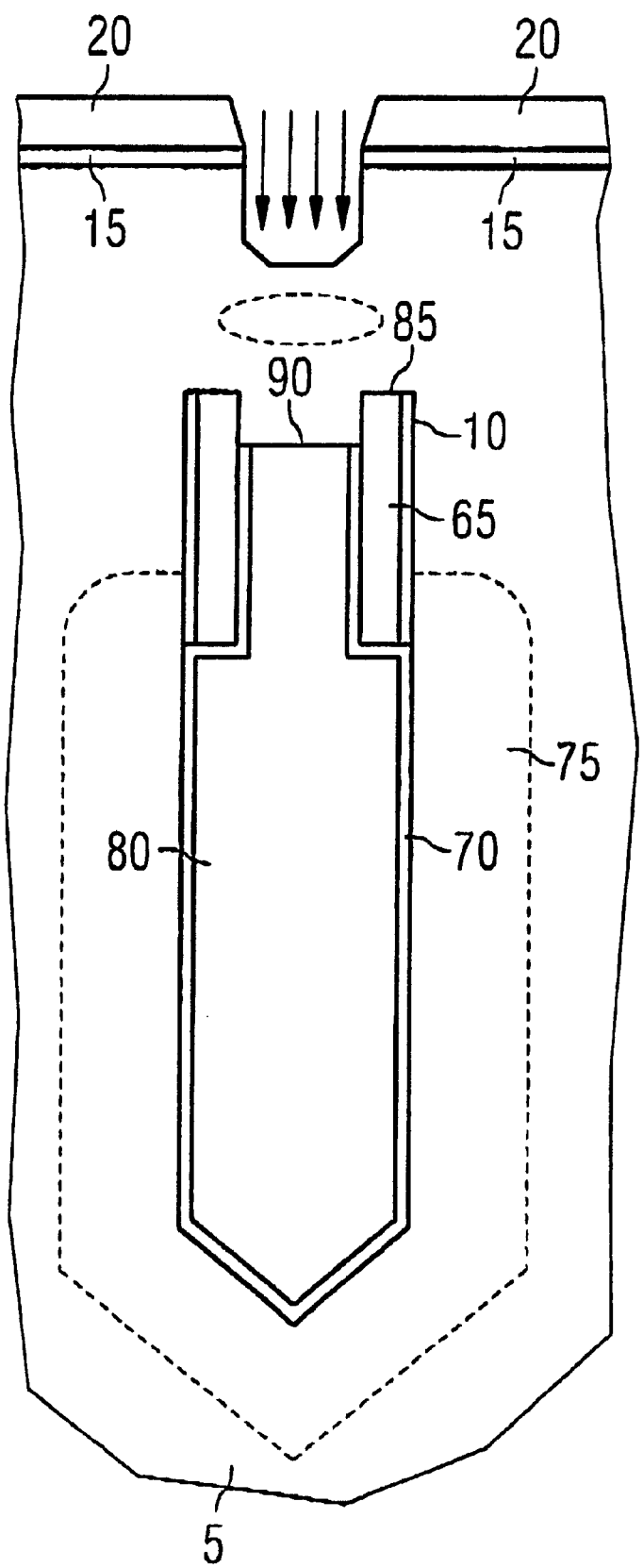
FIG. 19 shows a construction of the invention according to FIG. 16, whereby a trench is etched for a vertical selection transistor.

With reference to FIG. 19, a development of the trench capacitor shown in FIG. 16 is shown. Here, first the selectively grown epitaxial layer 100 is sunk at least partly into trench 10, using the etching mask defined through first masking layer 15 or through second masking layer 20; here a directed etching is used. A reactive ion etching can for example be used as the etching.

Figure 20:
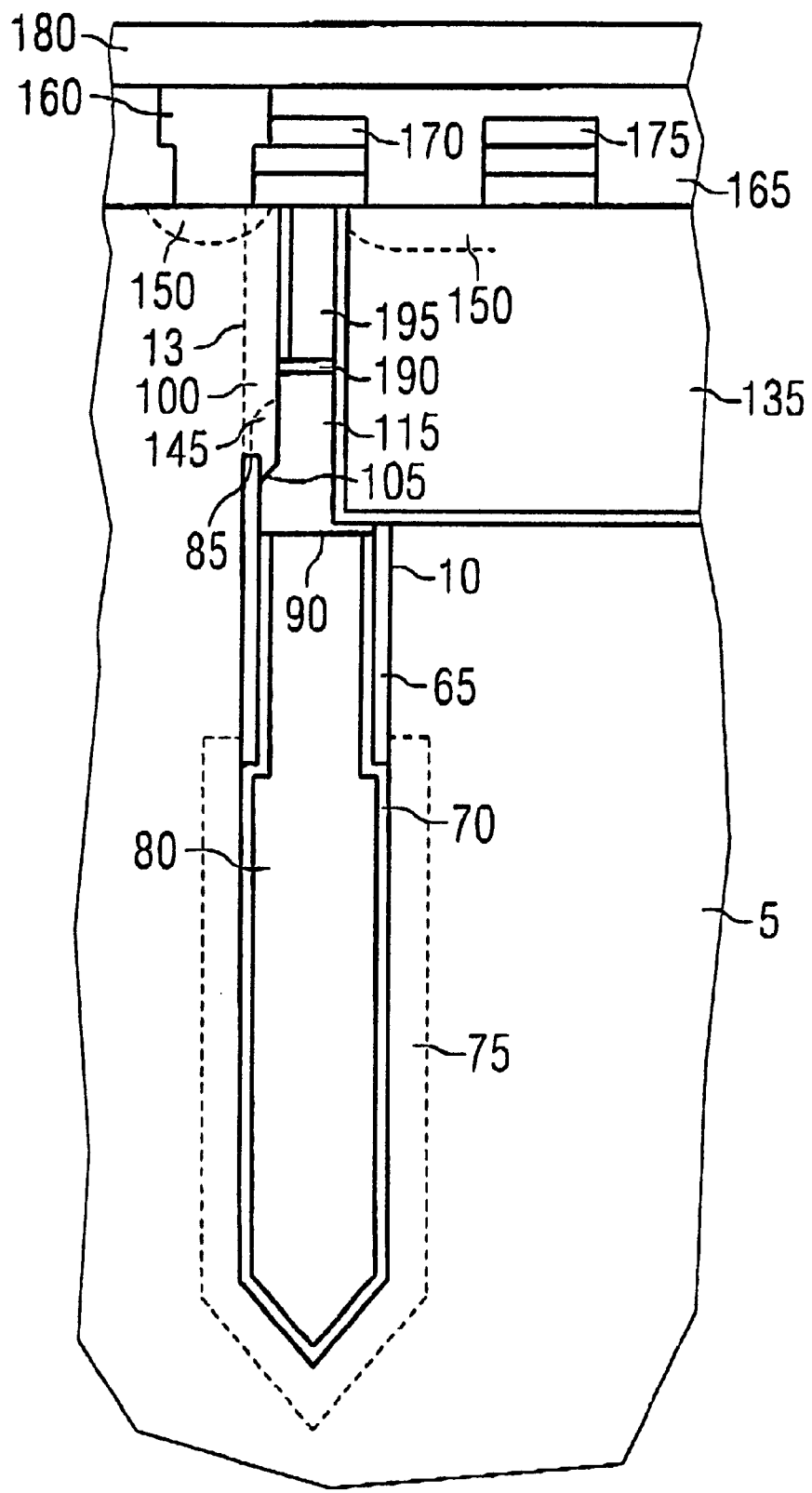
FIG. 20 shows a memory cell having a trench capacitor according to FIG. 19, whereby a vertical selection transistor is arranged.

In FIG. 20, a memory cell having a vertical selection transistor is shown that includes a trench capacitor according to FIG. 19. A third insulating layer 190 is situated on conductive trench filling 80 in trench 10. The gate, or word line contact 195, is situated on third insulating layer 190. Word line 170 is situated on word line contact 195. The vertical selection transistor comprises first doping region 145 and second doping region 150. The channel of the selection transistor is formed in selective epitaxial layer 100. Second doping region 150 of the selection transistor is connected with bit line 180 by means of bit line contact 160. In addition, insulating trench 135 is arranged for the insulation of the trench capacitor from adjacent trench capacitors. Word line 170 is situated directly perpendicular over the trench capacitor, in order to control gate 195 of the vertical selection transistor. Fitting word line 175 is arranged on insulating trench 135 next to word line 170.

I claim:

1. A method of manufacturing a trench capacitor, which comprises the following method steps:
   providing a substrate with a substrate surface;
   forming a trench with an upper region, a lower region, and a side wall in the substrate, the upper region being closer to the substrate surface than the lower region;
   isotropically etching the trench to widen the trench in the upper region and the lower region;
   conformally depositing a first insulating layer in the trench;
   etching the first insulating layer with directed etching to form the first insulating layer as a lateral edge web;
   removing the first insulating layer from the lower region of the trench, thereby forming an insulating collar in the upper region from the first insulating layer, the collar extending into the trench from the substrate surface down to a first sinking depth;
   forming a capacitor dielectric on the substrate in the lower region of the trench and on the insulating collar in the upper region of the trench;
   filling the trench with a conductive trench filling;
   sinking the insulating collar into the trench down to a second sinking depth located between the substrate surface and the first sinking depth, and exposing-the substrate on the side wall of the trench, above the second sinking depth;
   sinking the conductive trench filling and the capacitor dielectric into the trench down to a third sinking depth located between the first sinking depth and the second sinking depth;
   selective-epitaxially growing a selective epitaxial layer on the exposed side wall of the trench; and
   forming an electrical contact between the conductive trench filling and a doping region of a selection transistor.

2. The method according to claim 1, which comprises forming a masking layer on the substrate surface, and the directed etching of the first insulating layer is carried out selectively to the masking layer, with an etching gas containing a gas selected from the group consisting of $C_4F_8$, $C_{5F8}$, and $C_2F_6$.

3. The method according to claim 1, which comprises sealing the first insulating layer by subjecting the first insulating layer to oxidation at a temperature between 900° C. and 1050° C., for a time duration between 20 and 90 minutes, and in an atmosphere containing oxygen and nitrogen.

4. The method according to claim 1, which comprises forming an etching mask on the insulating layer in the upper region of the trench, and utilizing the etching mask in the step of removing the insulating layer from the lower region of the trench.

5. The method according to claim 4, which comprises:
   depositing in the trench a first trench filling on the first insulating layer, and sinking into the trench up to a first sinking depth, whereby the first trench filling is removed from the upper region of the trench;
   depositing a conformal masking layer in the upper region of the trench, on the first insulating layer and the first trench filling, and isotropically etching back the conformal masking layer; and
   forming lateral edge webs on the first insulating layer, and using the lateral edge webs as an etching mask for removing the first insulating layer from the lower region of the trench.

6. The method according to claim 4, which comprises:
   conformally depositing a masking layer on the first insulating layer in the trench;
   introducing a first trench filling in the trench onto the masking layer and sinking the trench filling into the trench down to a first sinking depth, whereby the first trench filling is removed from the upper region of the trench;
   converting the masking layer situated over the first sinking depth on the first insulating layer into a modified masking layer by injecting dopant on its surface;
   removing the first trench filling from the lower region of the trench selectively to the modified masking layer;
   removing the masking layer, selectively to the modified masking layer, from the lower region of the trench; and
   utilizing the modified masking layer as an etching mask for the removal of the first insulating layer from the lower region of the trench.

7. The method according to claim 1, which comprises forming a buried plate around the lower region of the trench, whereby dopant is injected into the substrate.

8. The method according to claim 1, which comprises:
   sinking the conductive trench filling down to the second sinking depth;
   subsequently isotropically etching the capacitor dielectric back to the second sinking depth;
   subsequently isotropically etching the insulating collar back to the second sinking depth;
   subsequently sinking the conductive trench filling in to the third sinking depth; and
   subsequently isotropically etching the capacitor dielectric back to the third sinking depth.

9. The method according to claim 1, which comprises forming a contact layer in the trench on the conductive trench filling.

10. The method according to claim 1, which comprises forming an intermediate layer on the selectively applied epitaxial layer.

11. The method according to claim 1, which comprises processing at a temperature between 900° C. and 1050° C., in an atmosphere containing hydrogen, at a pressure of approximately 2666 Pascal, to thereby reduce crystal defects in the epitaxially grown layer.

* * * * *